US012573984B2

(12) United States Patent
Daryoush et al.

(10) Patent No.: US 12,573,984 B2
(45) Date of Patent: Mar. 10, 2026

(54) INTEGRATED OPTO-ELECTRONIC OSCILLATOR CHIP AS MICROWAVE AND MILLIMETER-WAVE FREQUENCY SYNTHESIZER

(71) Applicant: Drexel University, Philadelphia, PA (US)

(72) Inventors: Afshin S. Daryoush, Bryn Mawr, PA (US); Kai Wei, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 11 days.

(21) Appl. No.: 18/567,984

(22) PCT Filed: Jun. 10, 2022

(86) PCT No.: PCT/US2022/032945

§ 371 (c)(1),
(2) Date: Dec. 7, 2023

(87) PCT Pub. No.: WO2022/261396

PCT Pub. Date: Dec. 15, 2022

(65) Prior Publication Data

US 2024/0267001 A1 Aug. 8, 2024

Related U.S. Application Data

(60) Provisional application No. 63/209,247, filed on Jun. 10, 2021.

(51) Int. Cl.
*H03B 17/00* (2006.01)
*H03B 28/00* (2006.01)
*H03K 3/42* (2006.01)

(52) U.S. Cl.
CPC ............. *H03B 28/00* (2013.01); *H03B 17/00* (2013.01); *H03K 3/42* (2013.01); *H03B 2200/0044* (2013.01)

(58) Field of Classification Search
CPC ....... G02F 1/0123; H03B 17/00; H03B 28/00; H03B 2200/0044; H03K 3/42;
(Continued)

(56) References Cited

U.S. PATENT DOCUMENTS

| 5,723,856 | A | * | 3/1998 | Yao | ........................ | G02F 1/0123 |
| | | | | | | 372/18 |
| 5,991,323 | A | | 11/1999 | Adams | | |

(Continued)

FOREIGN PATENT DOCUMENTS

WO 2020/023611 A1 1/2020
WO 2022/261396 A1 12/2022

OTHER PUBLICATIONS

Wei, K., et al., "Self-Forced Silicon Photonic Integrated Optelectronic Oscillators using High-Q Filtering Delay Lines", 2020 International Topical Meeting on Microwave Photonics (MWP), Jan. 12, 2021, Fig. 1, p. 181 [online] <URL: https://ieeexplore.ieee.org/abstract/document/9314586>.

(Continued)

*Primary Examiner* — Levi Gannon
(74) *Attorney, Agent, or Firm* — Schott, P.C.

(57) ABSTRACT

In absence of electrical approaches for realization of highly stable RF oscillator, opto-electronic oscillators (OEO) techniques are provided, where self-forced oscillation techniques using long optical delays demonstrate significant short-term and long-term frequency stability. Fully integrated opto-electronic oscillator chip (IOEC) may be the most efficient realization of an RF frequency synthesizer in terms of operation frequency (covering microwave and millimeter wave), size (<10 cm$^3$), ruggedness to environmental effects of temperature (−40 to 80 C), vibration (up to 40 g), low timing jitter (<5 fs for 40 GHz carrier), and wall-plug efficiency (output power >10 dBm from under 1 W power). A free-running III-V (primarily InP) based multi- (Continued)

mode laser (MML) diodes is designed with large mode number (e.g., over 60 modes) and intermodal oscillation frequency compatible with desired RF carrier signal (e.g., 1-40 GHz).

19 Claims, 8 Drawing Sheets

(58) Field of Classification Search
CPC .......................... H04B 10/505; H04B 10/5053; H04B 10/508; H04B 2210/006
See application file for complete search history.

(56) References Cited

U.S. PATENT DOCUMENTS

| | | | | |
|---|---|---|---|---|
| 2002/0090163 A1* | 7/2002 | Lim | ....................... | G02B 6/105 |
| | | | | 385/39 |
| 2004/0109217 A1* | 6/2004 | Maleki | ....................... | G04F 5/00 |
| | | | | 359/239 |
| 2010/0134876 A1 | 6/2010 | Fiddy | | |
| 2011/0064415 A1* | 3/2011 | Williams | ................ | G01S 13/58 |
| | | | | 398/115 |
| 2012/0294319 A1* | 11/2012 | Maleki | ....................... | G02F 1/39 |
| | | | | 372/18 |
| 2013/0259072 A1* | 10/2013 | Maleki | .................. | H01S 5/0656 |
| | | | | 372/20 |
| 2014/0186045 A1* | 7/2014 | Poddar | .................. | H04L 7/0041 |
| | | | | 398/115 |
| 2014/0270786 A1 | 9/2014 | Poddar et al. | | |
| 2018/0248518 A1* | 8/2018 | Nicholls | .............. | H03H 9/6406 |
| 2021/0167578 A1* | 6/2021 | Poddar | .................... | G02F 1/035 |

OTHER PUBLICATIONS

International Preliminary Report on Patentability issued Nov. 21, 2023, and Written Opinion of the International Searching Authority completed on Aug. 17, 2022, 9 pages.

International Search Report for the International Application No. PCT/US22/32945, completed on Aug. 17, 2022, 3 pages.

Daryoush, A.S., et al. "Compact and Highly Stable Frequency Synthesizers for Integrated RF Front-Ends." mwjournal.com [online], Aug. 13, 2021 (Aug. 13, 2021), entire document [online] <https://www.microwavejournal.com/articles/36516-compact-and-highly-stable-frequency-synthesizers-for-integrated-rf-front-ends>.

* cited by examiner

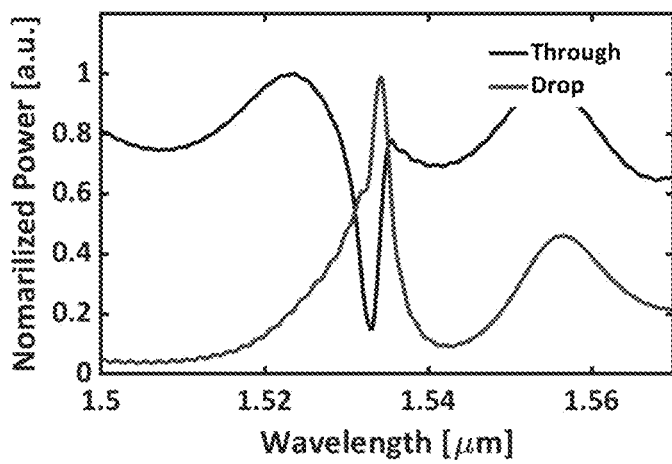
FIG. 13(a)
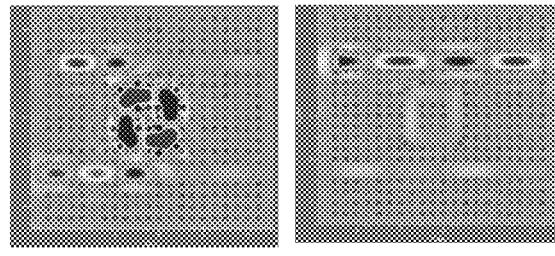
FIG. 13(b)
FIG. 13(c)

INTEGRATED OPTO-ELECTRONIC OSCILLATOR CHIP AS MICROWAVE AND MILLIMETER-WAVE FREQUENCY SYNTHESIZER

TECHNICAL FIELD

The disclosed device(s) are in the field of active and passive opto-electronic devices for realization of a stable and tunable radio-frequency (RF) source as a frequency synthesizer.

BACKGROUND

Future telecommunication and remote sensing may require a larger bandwidth of information to be processed. One component may need efficient frequency translation for modulated carrier generation and detection of information using demodulation of baseband signals. As information content is increased, a broader bandwidth may be required to maintain high spatial and temporal content.

The ratio of the information bandwidth to carrier signal is known as fractional bandwidth and most practical systems of higher integrity and lower cost are limited to a maximum fractional bandwidth of 30%. For large information capacity in wireless and wired communications, RF carrier frequencies may be pushed from microwave (300 MHz-30 GHz) domain to millimeter wave (30 GHz-300 GHz), while it is anticipated the sub-millimeter wave frequencies (300 GHz-3 THz) are to be the next target of super high-resolution information content.

Unfortunately, due to reduced quality factor of resonators at microwave and millimeter-wave frequencies, the electronic techniques of RF signal generation do not meet short term stability (close-in to carrier phase noise and timing jitter) or long terms frequency stability (Alan variance) and thus, opto-electronic oscillator (OEO) techniques may be required. Standard OEO requires a long optical delay to achieve a very high Q factor required for frequency stability. In addition, the long optical delays may introduce optical side-bands that are inversely proportional to optical delays, which provide a clean close-in to carrier at select frequencies below the optical-side mode frequencies, but leads to degraded timing jitter.

A compact realization of OEO is based on large number of modes in the multi-mode laser (MML), which may suffer from poor frequency stability. Therefore, innovative approaches may be developed for stabilization of the inter-modal RF oscillation signal of the MML using internal feedback for counter propagating self-mode locking (SML) technique combined with the coherent external feedback using self-forced oscillation techniques of self-injection locking (SIL), self-phase lock loop (SPLL), and self-injection locked phase locked loop (SILPLL). The external feedback may be attained using over km (5 ☒ s delay) long fiber-optic delay lines. These techniques of SML demonstrate modular frequency synthesizers over X-band and K-bands meeting both short and long term stability of inter-modal oscillations for RF oscillators operating.

Desire for low-cost manufacturing, small size (under 10 cm³), and high tolerance to adverse environmental effects of temperature variation (−40 to +80 C) and vibrational effects (up to 40 g) demand a as a fully integrated OEO techniques.

SUMMARY

The device(s) and techniques described herein may be compatible with chip level realization of OEO based frequency synthesizers that maintain a very high stability using a combined SML and SILPLL functions in MML.

The disclosed device(s) are in the field of active and passive opto-electronic devices for realization of a stable and tunable radio-frequency (RF) source as a frequency synthesizer. The optical source may be made of a mutually-coupled multi-mode laser (MML) with inter-modal oscillation frequency that matches with the desired RF source and stabilized using self-forced and self-mode locking processes. Passive optical components may be optical power dividers/coupler, dispersive optical delay elements, and both electrical to optical modulator (either phase or intensity modulator) and optical detectors. The electronic control functions of power conditioning and phase error detections are used for boosting RF signal and detecting any phase error deviations. The frequency stabilized RF source may be economical and small size with low environmental sensitivity of vibration and temperature. This frequency synthesizer has prominent role as a local oscillator used for coherent communication systems and as clock signal in both analog-to-digital (ADC) and digital-to-analog (DAC) converters. It is also employed as exciter for radar, remote sensing, and intelligent signals.

The present invention may be understood more readily by reference to the following detailed description taken in connection with the accompanying figures and examples, which form a part of this disclosure. It is to be understood that this invention is not limited to the specific devices, methods, applications, conditions, or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it may be understood that the particular value forms another embodiment. All ranges are inclusive and combinable.

It is to be appreciated that certain features of the invention which are, for clarity, described herein in the context of separate embodiments, may also be provided in combination in a single embodiment Conversely, various features of the invention that are, for brevity, described in the context of a single embodiment, may also be provided separately or in any sub-combination. Further, reference to values stated in ranges include each value within that range.

BRIEF DESCRIPTION OF THE DRAWINGS

FIG. 10(a) conceptual image, physical images of single ADF with FIG. 10(b) short delay and FIG. 10(c) long delay using serpentine design with overall dimensions of 50⬜ m×150⬜ m.

FIGS. 13(a)-13(c) show FIG. 13(a) Normalized transmission spectra of the designed 2-D PhC based ADF and FIG. 13(b) optical field for wavelength of on (top) and off (bottom) resonance. FIG. 13(c) shows calculated time delay for the drop port as a function of wavelength.

DETAILED DESCRIPTION OF ILLUSTRATIVE EMBODIMENTS

Figures 1, 2:
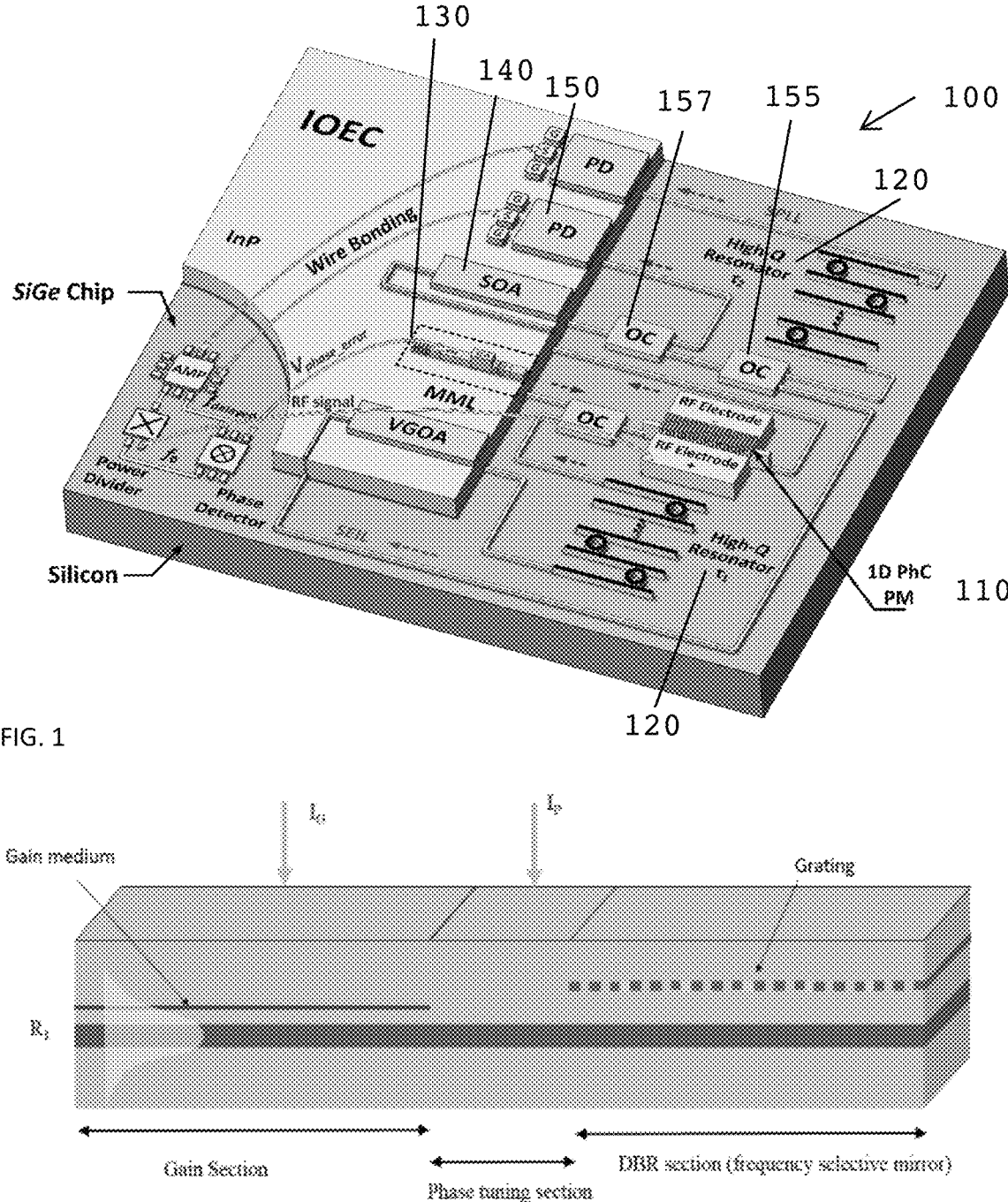
FIG. 1 shows the IOEC design.
FIG. 2 shows the conceptual representation of an MML.

1 Description for Integrated Opto-Electronic Oscillator Chip as Microwave and Millimeter-Wave Frequency Synthesizer

1.1. Summary

The description may be further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale.

The IOEC design 100 is shown in FIG. 1, which includes electro-optic (E-O) modulators with 1-D photonic crystal (PhC) based slow-light structures for improved phase modulation capability 100 combined with cascaded add-drop filter (ADF) resonators 120 for high-Q filtering delay elements. The InGaAsP/InP MML (0.8×4.1 mm2) chip (130 shown in dash-line box section of FIG. 1) is developed using foundry service and is demonstrated employed as phase to intensity convertor (PM-IM) at RF (e.g., microwave frequency of X-band). The MML suffers from a poor RF frequency stability at 11.7 GHz. The self-electrical injection locked (SEIL) and dual self-phase-locked (DSPLL) loops are introduced for a greater frequency stability.

To construct the self-forced loops, the instantaneous light output from the MML 130 is coupled to the path to be modulated by the E-O modulator 100 and amplified by a semiconductor optical amplifier (SOA) 140. For RF output observation and RF modulation of the modulator, a partial output is directly detected by a photodetector (PD) 150. The rest is equally split into two separate optical paths: half is self-injected into the main loop via another 3-dB optical coupler (OC) after τ1-ODL (optical delay line) delay for SEIL function 155, while the other half 157 is for the operation of PLL after τ2-ODL delay using high-Q ADF cascaded resonators and detection by a PD. The optical and electronic gain control are provided by the variable gain optical amplifier (VGOA) and SiGe RF amplifier (AMP), respectively.

FIG. 2 shows the conceptual representation of an MML based on an optical semiconductor amplifier (SOA), a phase modulator (PM), a distributed Bragg reflector (DBR) as optical mirror.

Figure 3:
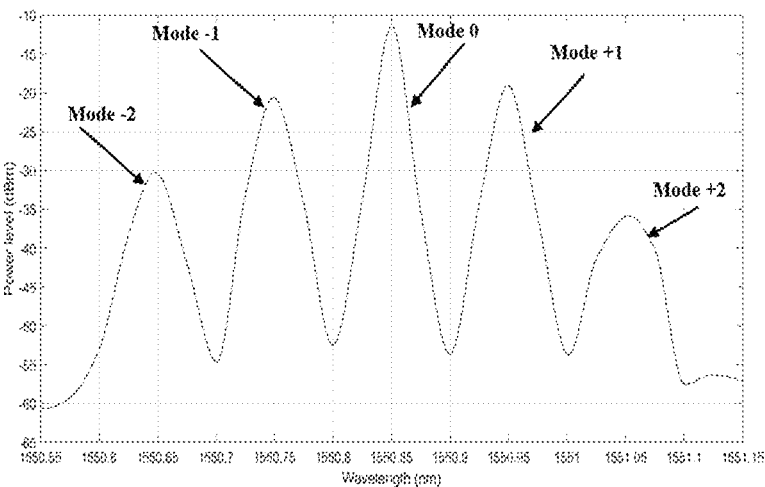
FIG. 3 shows a typical measured optical spectrum of the integrated laser.

The optical output of this laser under test may be monitored on optical spectrum analyzer through lensed fiber and optical coupler, while a high-speed photodiode is to monitor RF inter-modal oscillation signal characteristics. A typical measured optical spectrum of the integrated laser is shown in FIG. 3, where there are 5 dominant modes existing in multi-mode laser operation. For example, the measured optical output power for the fundamental mode is around −13 dBm at 1550.85 nm, when SOA injection current is 100 mA. The mode gap between each mode is around 11.6 GHz, which matches well with estimated effective cavity length of 13.065 mm. The intermodal oscillation is then employed for RF signal generation and overall phase noise improvement of an MML with long optical cavity. By changing the bias voltage of the PM section from 0V bias to −6V, the center optical wavelength is shifted from 1550.859 nm to 1550.933 nm, while the intermodal oscillation frequency changes over 2.1 GHz away from 11.6 GHz.

Figure 4:
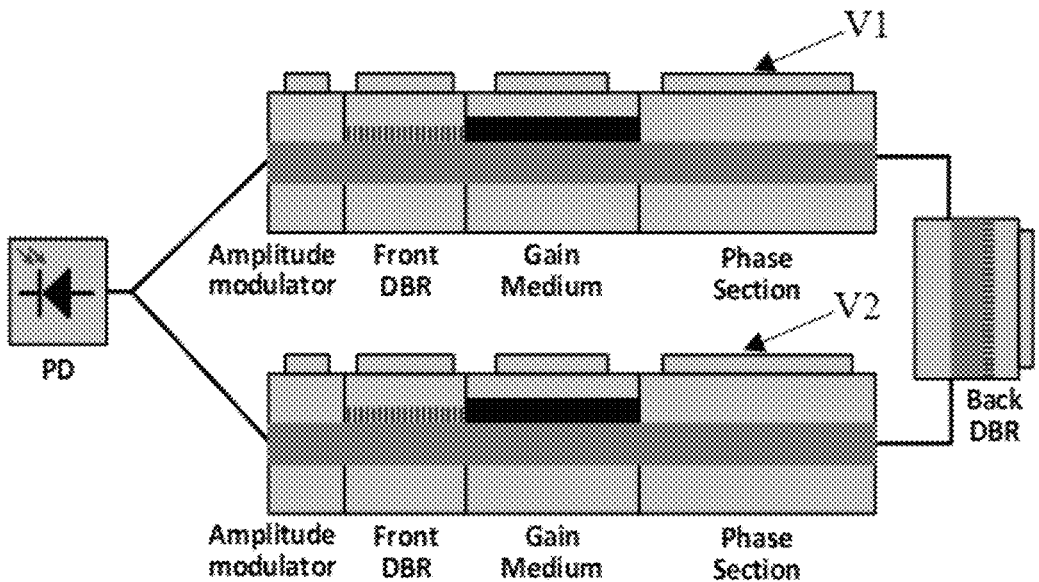
FIG. 4 shows a system diagram of a compact MML as frequency synthesizer.

After introducing the basic structure of a normal DBR laser, a design may also include a shared DBR plus an electro-absorption modulator. The overall system diagram of a compact MML as frequency synthesizer is provided in FIG. 4. Two laser pairs share one DBR (back DBR section) using its bidirectional characteristic. Meanwhile, in order to minimize the effects introduced by this shared DBR, the length of DBR may be set (e.g., to 500 μm for 5 modes with intermodal oscillation at X-band). The output from each DBR laser is combined using a Y-junction (see FIG. 2), providing input to a high-speed photodetector for efficient detection of the ultra-stable RF signal beat-notes. The electro-absorption modulator is also integrated in the simulation set-up and its design operation is discussed below.

Figure 5:
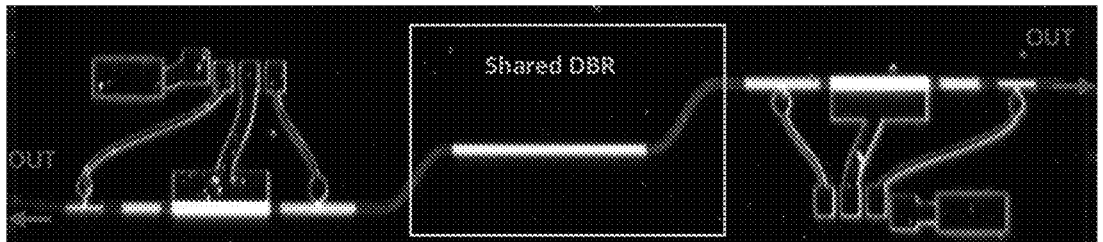
FIG. 5 shows shared DBR laser pairs designs.

Besides the integrated DBR based multi-mode laser, shared DBR laser pairs designs are displayed in FIG. 5. The shared DBR laser includes 4 major sections of PM, SOA, DBR and EAM in symmetric laser design which takes total of 4.6×1.2 mm² on the chip. The symmetry is significant because when the individual MML operate at different wavelength, the gap of their center frequency could be too large for beat-notes operation to appear at lower microwave frequencies. The selected dimensions for each segment of multi-section semiconductor lasers for a particular realization covering X-band frequencies for 5 overlap modes as follows: each laser has SOA of 400 μm, PM of 300 μm, and front DBR of 150 μm. Finally, the external EAM are selected with 150 μm, which primarily control the number of available modes out of each MML. Interaction between mode-locked lasers provide frequency generation and synthesis.

Figure 6A:
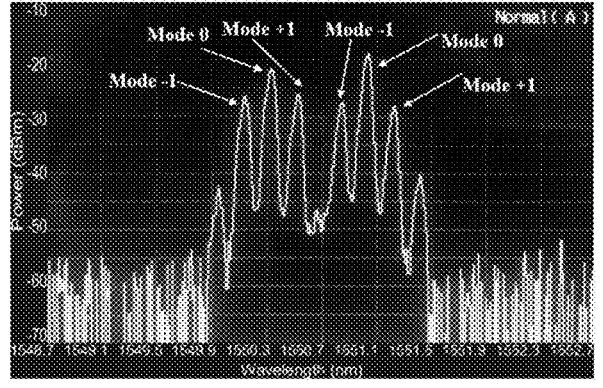
FIG. 6a shows optical spectra of two symmetric multi-section lasers.
Figure 6B:
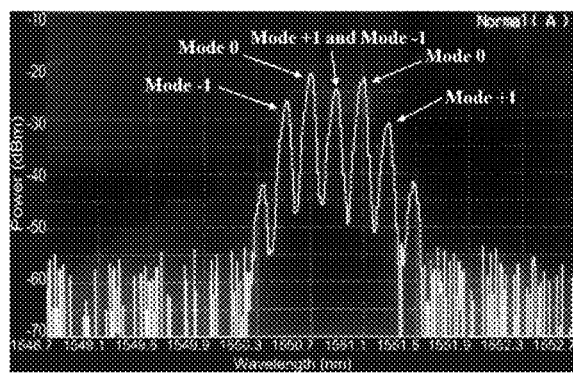
FIG. 6b shows operating condition of five modes on the optical spectral analyzer.

FIG. 6a depicts optical spectra of two symmetric multi-section lasers with each having 3 dominant modes, as observed on Anritsu MS9710A OSA. Mode 0 of left MML is at 1550.322 nm at −21.7 dBm, while for laser right is at 1551.032 nm at −19.1 dBm. SOA bias of 55 mA, PM bias of −1.0V, and EAM 0.0V for laser left and for laser right SOA bias current of 52 mA, PM bias of 0.0V, and EAM bias of 0.0V. FIG. 6b depicts operating condition of five modes on the optical spectral analyzer (mode +1 of laser left overlapping with mode −1 oflaser right). Mode 0 ofleft is at 1550.691 nm at −22.1 dBm, while for laser right is at 1551.107 nm at −22.5 dBm. SOA bias of 65 mA, PM bias of −4.0V, and EAM 0.0V for laser left and for laser right SOA bias current of 53 mA, PM bias of −1.0V, and EAM bias of 0.0V.

Figure 7:
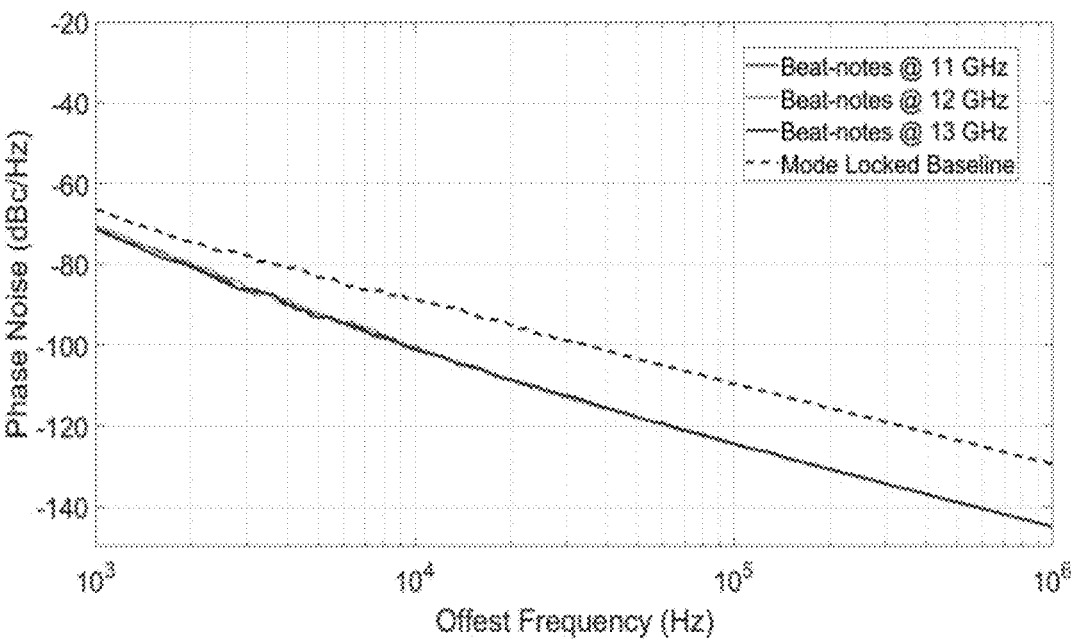
FIG. 7 shows a comparison of the phase noise performance for the beat-note output with 3 self-locked modes in each laser.

The concept of frequency synthesis could be achieved by applying control current and voltages. For example, frequency tuning of 11 GHz, 12 GHz, and 13 GHz using the structure of FIG. 7 is attained. Comparison of the phase noise performance for the beat-note output with 3 self-locked modes in each laser is shown in FIG. 7. These synthesized RF frequencies of 11, 12, and 13 GHz have RF power levels of 4.79, 4.80, and 4.70 dBm respectively and exhibit a very low phase noise.

Figure 8:
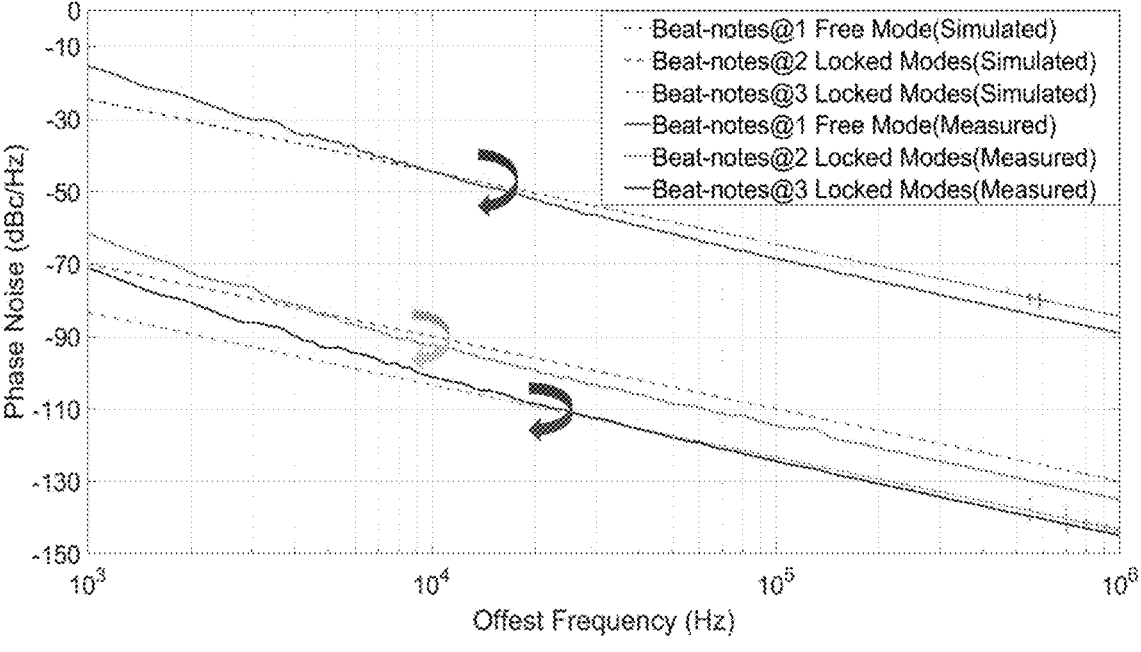
FIG. 8 shows a comparison of the measured and simulated phase noise performance of the beat-note output for different numbers of locked modes in each laser.

FIG. 8 depicts comparison of the measured and simulated phase noise performance of the beat-note output for different numbers of locked modes in each laser, when the overlap mode are either 1 mode (red), 2 modes (green), or 3 modes (blue).

Calculated phase noise and timing jitter performance comparison for various number of modes in an SML MML are depicted in Table 1.

| SML Mode Number | Phase Noise @ 1 kHz offset [dBc/Hz] | Phase Noise @ 10 kHz offset [dBc/Hz] | Timing Jitter over 300 Hz to 30 kHz [fs] |
|---|---|---|---|
| 5 | −73.4 | −93.8 | 277 |
| 13 | −89.7 | −110.2 | 45 |
| 23 | −101.5 | −121.9 | 11 |
| 61 | −114.3 | −134.8 | 2.5 |
| 125 | −122.6 | −142.7 | 1.4 |
| 201 | −136.0 | −156.3 | 0.2 |

Figure 9:
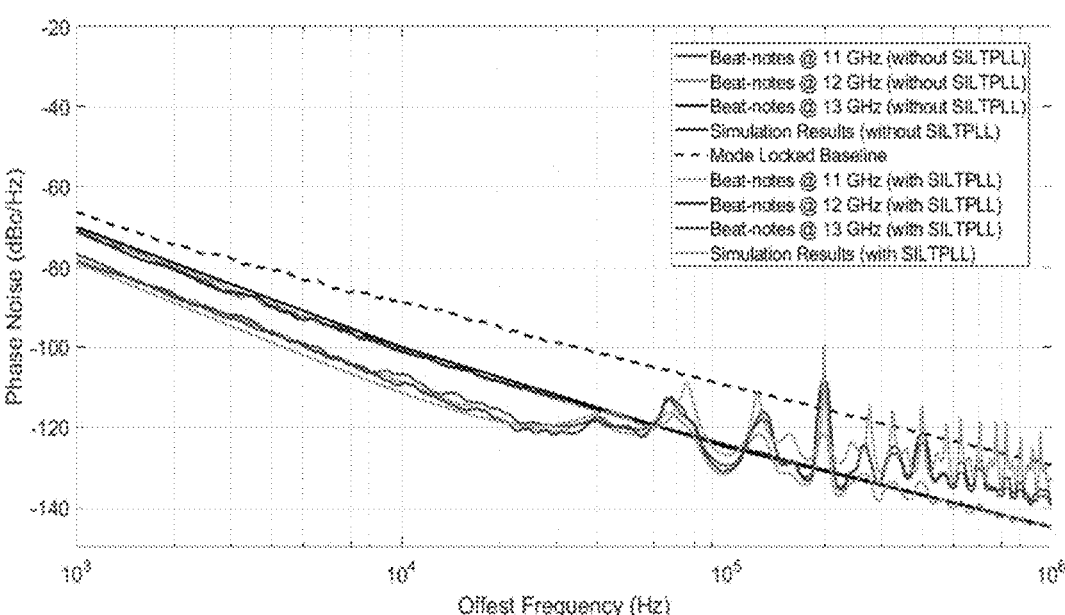
FIG. 9 shows a phase noise performance comparison for beat-notes output over 11 GHz, 12 GHz, and 13 GHz with 5 self-locked modes with and without self-forced oscillation of SILTPLL.

Phase noise performance comparison for beat-notes output over 11 GHz, 12 GHz, and 13 GHz with 5 self-locked modes with and without self-forced oscillation of SILTPLL are compared in FIG. 9, where performance comparison to modeling and measured results are depicted. The measured results show that the SML with SILTPLL of the frequency synthesized 11, 12, and 13 GHz are clustered together with identical phase noise, while the measured performance of the synthesized beat notes of SML at the 11, 12, 13 GHz without SILTPLL is also clustered together, but at an inferior phase noise.

Figures 10A, 10B, 10C:
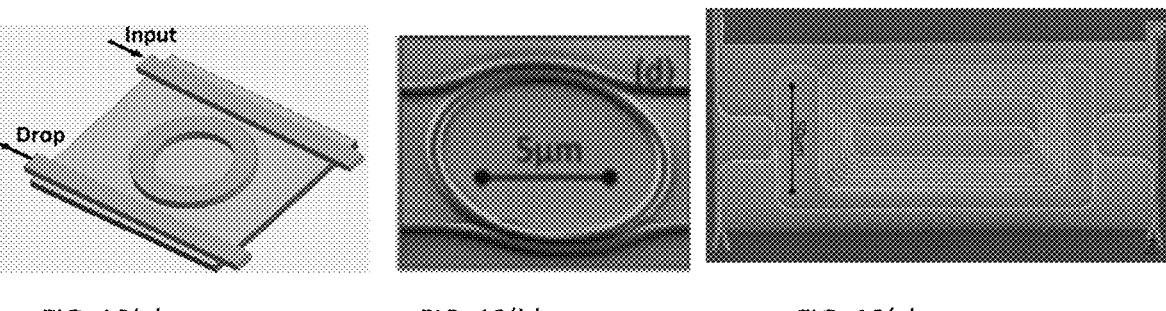
FIGS. 10a-10c show a configuration of homogenous add-drop filter (ADF) resonators.

FIGS. 10a-10c show a configuration of homogenous add-drop filter (ADF) resonators: FIG. 10(a) conceptual image, physical images of single ADF with FIG. 10(b) short delay and FIG. 10(c) long delay using serpentine design with overall dimensions of 50▯ m×150▯ m.

Figure 11:
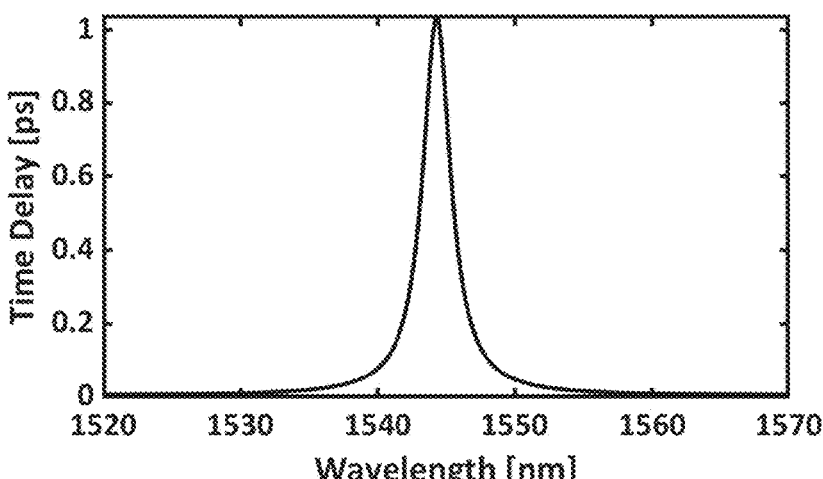
FIG. 11 shows comparison of calculated time delay through the drop port against wavelength using hybrid modeling.
Figures 12A, 12B:
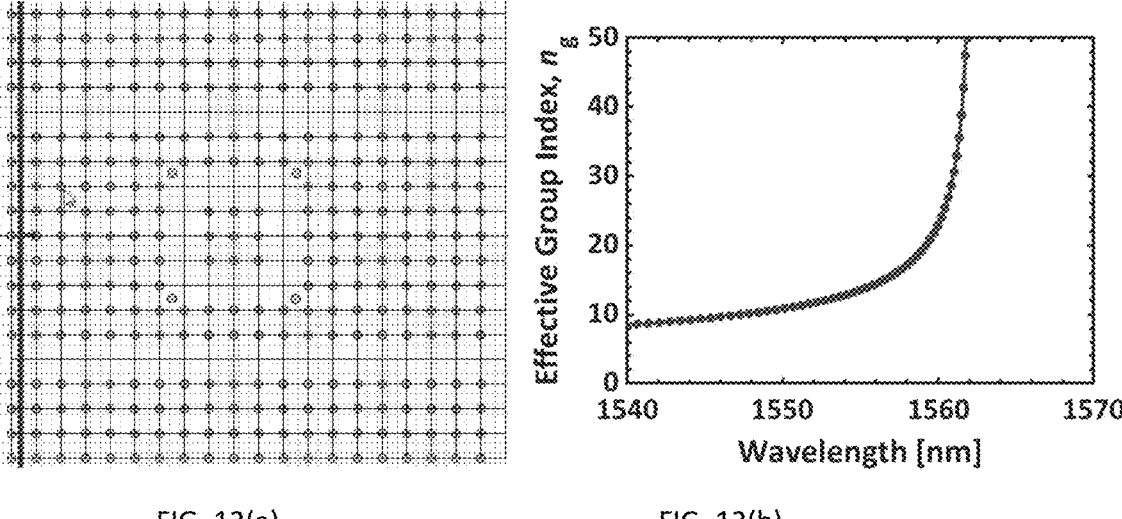
FIG. 12(a) shows a layout sketch of the 2-D PhC based ADF resonator with rod scatterers and FIG. 12(b) shows calculated effective group index.

FIG. 11 shows comparison of calculated time delay through the drop port against wavelength using hybrid modeling for R=1.7▯ m, gap=55 nm at Wavelength of 1545 nm FIG. 12(a) shows a layout sketch of the 2-D PhC based ADF resonator with rod scatterers and FIG. 12(b) shows calculated effective group index.

FIGS. 13(a)-13(c) show FIG. 13(a) Normalized transmission spectra of the designed 2-D PhC based ADF and FIG. 13(b) optical field for wavelength of on (top) and off (bottom) resonance. FIG. 13(c) shows calculated time delay for the drop port as a function of wavelength.

Table 2 depicts comparison of comparison of predicted optical delay for 2-D PhC ADF for various radii using the hybrid modeling at on-resonance of 1534 nm

| | R = 1.5 μm | R = 100 μm | R = 250 μm | R = 500 μm |
|---|---|---|---|---|
| Time delay [ns] | 0.2 | 5.1 | 5.8 | 6 |

Figure 14A:
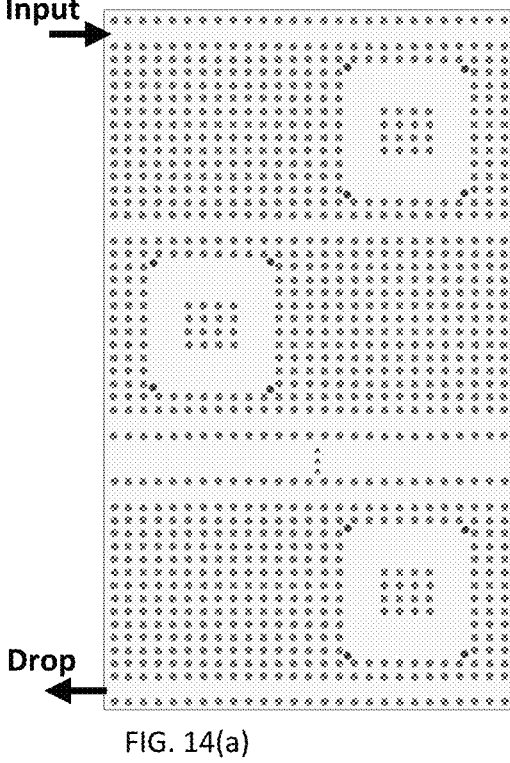
FIG. 14(a) shows a block diagram of the n cascaded 2-D PhC based ADF resonator structure and FIG. 14(b) shows estimated time delay of different order of n.
Figure 14B:
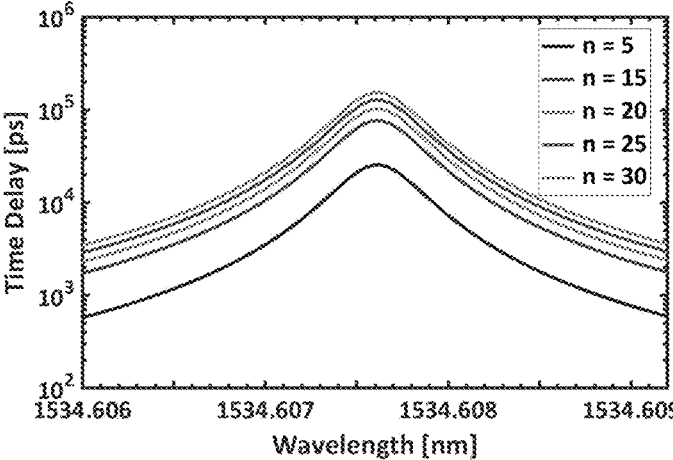

FIG. 14(a) shows a block diagram of the n cascaded 2-D PhC based ADF resonator structure and FIG. 14(b) shows estimated time delay of different order of n.

Figure 15:
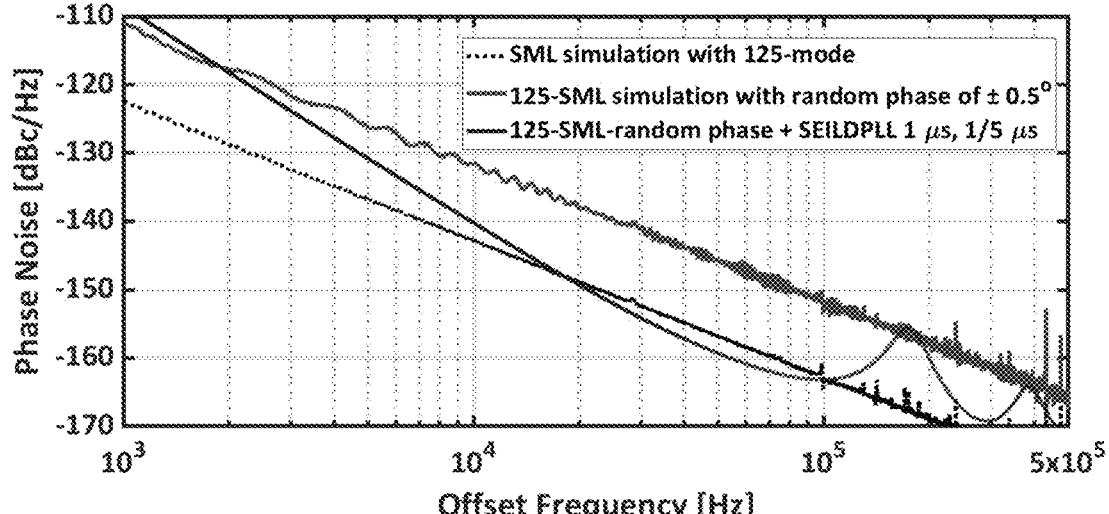
FIG. 15 depicts estimated phase noise performance of self-forced (SEILDPLL) OEO using on-chip high-Q delay elements to correct for random phase of ±0.5o in SML MML at 10 GHz using 125 modes.

FIG. 15 depicts estimated phase noise performance of self-forced (SEILDPLL) OEO using on-chip high-Q delay elements to correct for random phase of ±0.5° in SML MML at 10 GHz using 125 modes.

1.2 Detailed Description

The overall concept of an integrated opto-electronic integrated chip is demonstrated in FIG. 1, where a heterogeneously integrated InP chip of active optical components on Si-Photonics platform for both passive optical components and integrated RF circuits for control functions. Realization of MML could be implemented using III-V semiconductors (e.g., InGaAsP/InP for near infra-red for mode numbers up to 61 with intermodal oscillation of 40 GHz or AlGaN/GaN for blue-green visible light for 201 modes with inter-modal oscillation of 110 GHz), while implementation of low optical loss components of optical delay elements are to be made on Si (e.g., SiN or SiO$_2$).

The MML may be constructed by optical gain (e.g., semiconductor optical amplifier, SOA), optical phase modulator (e.g., p-i-n phase modulator, PM), broadband bandpass filters as optical mirrors (e.g., distributed Bragg reflector, DBR), and mode number control (e.g., electro-absorption modulator, EAM). A simplified concept DBR laser, as depicted in FIG. 2 demonstrates the basic realization of MML. The 5 modes output from the MML for a typical design implemented is depicted in FIG. 3.

By incorporating additional MML that share a common DBR section, the concept of counter-propagating MML is attained (FIG. 4), where modes of each laser are to interact with one another depending on adjustments in bias current of SOA and PM. The number of modes exiting each MML is also adjusted by the applied bias control to EAM. A photomicrograph of a chip depicting realized counter propagating MML is depicted in FIG. 5 as an example of realized counter-propagating MML.

To realize the broadband frequency synthesis required in frequency synthesizers, two MML pairs (compare FIG. 4 for concept and FIG. 5 for photomicrograph of a practical design) are employed. The counter-propagating laser light feedback is first used for self-mode locking of the laser modes and then frequency synthesis is achieved by using wavelength detuning of each MML with respect to the other to easily provide tunable RF beat notes.

A better understanding of frequency synthesis is established through observation in both optical spectra and RF spectra. FIGS. 6(a) and 6(b) show performance of optical spectra of two counter-propagating MML for two cases of free-running (FIG. 6a) and self-mode locked (FIG. 6b). The measured fundamental mode optical power levels of the two lasers are approximately −20 dBm on OSA, which is adjusted by SOA bias current and reflectivity of DBR sections. Note their intermodal gap is controlled by the total length of each DBR laser and for the example shown in FIG. 5 is approximately 0.21 nm. As depicted in FIG. 6*a*, the power ratios of the side modes to the fundamental mode are −5 dB and −8 dB for the left laser and right laser, respectively. Note for convenience the three modes from each laser measured by the OSA are labeled as modes 0 (fundamental mode) and modes −1 and +1, where modes −1 and +1 are separated to the left and right of the fundamental dominant mode by an intermodal oscillation wavelength of 0.21 nm (i.e., 26.4 GHz) for each laser. Other less prominent modes are ignored because their amplitudes are at least 20 dB below the dominant modes. These uncorrelated modes entirely operate in a free-running manner since there is not sufficient feedback between individual laser structures. The phase noise performance of the intermodal RF oscillation is measured in terms of the optical feedback strength.

The intermodal RF oscillation of the counter-propagating lasers is then tested when 5 modes are self-mode-locked. Since each laser has 3 modes in total, the maximum number of modes with at least one overlapping mode is 5 modes. As an example, the correlated modes' spectra are illustrated in FIG. 6*b*. Mode +1 in the left laser overlaps with mode −1 in the right laser, which provides exactly 5 modes that are correlated. Mode +1 in the left laser and mode −1 in the right laser overlap, and the measured power level at a wavelength of 1550.900 nm is also almost doubled compared to that of the free-running condition. The bias conditions for different sections of the two lasers when only 1 mode overlaps are listed in FIG. 6*b*. The PM and EAM voltages are used to control the number of modes.

The best interactions of 5 locked modes of inter-modal oscillations at 26.4 GHz attains a measured phase noise of −92 dBc/Hz at 10 kHz offset, which is 55 dB improvement comparing with the free-running case at optimum feedback power ratio of around −10 dB comparing with the laser output in the optical cavity. Besides the phase noise, the estimated timing jitter is 72 fs, a 1000 times lower jitters than the estimated 70 ps for the free-running case over bandwidth of 1 kHz-1 MHz.

Note FIG. 6*b* shows optical spectra of when three modes are overlapped, while the frequency detuning is set to zero. This self-mode-locking process combined with the frequency detuning of multimode laser sections have a great potential of building RF synthesizers. For example, when the beat notes are reduced to the X-band range instead of the intermodal operation frequency of 26.4 GHz, the related phase noise performance, depicted in FIG. 7, is better than the intermodal baseline, and the best phase noise is −71 dBc/Hz at a 1 kHz and −100 dBc/Hz at a 10 kHz offset carrier frequencies at X-band. The reason for this improvement is that the beat-note output is almost half of original intermodal oscillation of 26.4 GHz, hence a 6 dB improvement in phase noise is expected.

Analytical and numerical modeling of SML for lasers with various numbers of modes indicates that a higher number of modes leads to a greater stabilization of inter-modal oscillation. For example, a larger mode number provides better phase noise performance for the generated beat-note output over 11-13 GHz, as depicted in FIG. 8. Moreover, the best performance is expected when a larger number of modes are overlapped. Therefore, the close-in to carrier phase noise could be further reduced as number of mode number in each MML is increased.

This SML technique forces one laser output to be coherent with another by locking the overlapped modes of the symmetric lasers through tuning of the bias currents of SOA and voltages of PM and EAM. The counter propagating light from the multi-mode laser pairs is phase cohered through the shared DBR and added external interaction processes. The key points to realize SML in this diagram is that these two symmetric lasers may be optimized for overlapped modes to lead to correlated low phase noise inter-modal RF oscillations. Moreover, as optical modes generated by the MML are locked, random optical oscillation is forced to be coherently synchronized to the adjacent modes; therefore, the detected free-running RF signal gains better frequency stabilization. Table 1 shows the comparison of phase noise estimation of SML based IOEO calculated by the established mode-locking modelling of MML. Self-mode locked MML generates ultra-stable optical signals, and the reconstructed RF signal is thus highly stabilized, where for timing jitter of is reduced from 277 fs at 5 modes to 45 fs for 13 modes. An unprecedented timing jitter of smaller than 2.5 fs is expected for more than 60 modes that are SML Unfortunately as the number of modes increases a small phase error as small as 1 degree variance causes degradation of timing jitter. For example, the predicted timing jitter for 125 modes for MML intermodal oscillation of 10 GHz is to degrade from 0.5 fs to 1.9 fs.

Self-forced oscillation of the MML may be address this realistic degradation. The self-forced oscillation of SIL and SPLL may be used with IOEC. The self-forced oscillation relies on comparison of instantaneous (e.g., t) phase noise due to oscillator drift against the similar oscillation frequency from an earlier times ahead by $\tau_o$ (i.e., t−$\tau_o$). Time delay of $\tau_o$ may be attained using low loss optical delay and in most applications, historically fiber optic delay lines are used. As an example, performance improvement achieved by adding to SML laser, the concept of SILPLL may encounter long delays. Multiple delay loops may provide a greater reduction in the close-in to carrier phase noise and non-harmonically related delay lengths results in reduction of spurious side modes. For example, superior performance may be achieved using triple self-phase locked loops (TSPLL) with optical delay lengths of 1 km, 3 km, and 5 km. In addition, an SIL of 5 km may reduce far-away from carrier phase noise, as SILTPLL. For example, the phase noise comparison of an X-band frequency synthesizer (covering 11-13 GHz) is presented in FIG. 9 using a combined effect of SML with and without SILTPLL.

To achieve optical delays, high Q resonators are attractive, as whispering Gallery Mode (WGM) resonators or Fabry-Perot resonators, with small size and high optical Q-factor of over $10^8$ under critical light coupling could result in RF loaded Q-factor of under $10^4$. To achieve highly compact integration, a high-Q microdisk resonator (MDR) on a single chip with its size of about 1.3×2 mm$^2$. In addition, micro-ring resonators (MRR), both all-pass and add-drop configurations, could achieve moderate delays, as shown in FIG. 10*a* and some practical design realizations of various ADF resonators are depicted in FIG. 10*b* with a diameter of about 5 μm, However, MRRs are subject to the radius of the ring waveguide that determines the free-spectral range (FSR), finesse of the resonator (F), and transmission characteristics (H). In practice, optical bending loss and 3-dB bandwidth of a ring that is specially associated with the add-drop filter (ADF) structure may be optimized to accommodate the modulated optical modes to be dropped, as depicted in FIG. 11.

To meet with the long delay requirement, the defect ring waveguide with a larger radius may be selected for the two-dimensional (2-D) PhC based ADF design, as depicted in FIG. 12*a*, where a rectangular resonator is converted to hexagonal shape by adding scattering rod is key locations. Nevertheless, the required simulation time is long due to the complexity of the structure in an integrated circuit Therefore, a proven hybrid modeling of time delay calculation for homogenous material based ADF resonators is extended to estimate the achievable time delay for the dispersive material based ADFs at on-resonance wavelength. The coupling coefficient which is determined by the number of rows of dielectric rods between the defect bus waveguide and defect ring waveguide is predicted using transfer function at on-resonance wavelength. Using the same analytical modeling of transfer function, then the time delays of 2-D PhC ADF resonators with larger dimensions is estimated, while other parameters remains unchanged.

With the calculated effective group index in FIG. 12b, designed radius of ring waveguide and the time delay obtained by full-wave simulation shown in FIG. 13c, while the wavelength dependent transfer function of this ADF is rendered in FIG. 13a.

Note the optical field modeling for this 2D-PhC MRR with defect based MRR is simulated at on-resonance and off-resonance wavelengths as depicted in FIG. 13b top and bottom respectively. The estimated time delays of 5.1 ns, 5.8 ns and 6 ns are for R=100 μm, 250 μm and 500 μm respectively, as shown in Table 2. Note, advantage of a larger radius MRR is not apparent, and it is beneficial to restrict radius to 100 μm. Moreover, the on-resonance wavelength slightly shifts with various radii of the defect based MRR waveguide; therefore, the practical design may be finely tuned.

Since the achieved time delay is not linearly dependent on the radius for the dispersive configuration, cascaded 2-D PhC based ADF resonators as conceptually shown in FIG. 14a could be an option for implementation of longer time delays. Therefore, R of 100 μm may be used for time delay calculation in the cascaded case to maintain a smaller chip size, while maintaining a low optical loss. While in the cascaded 2-D ADF certain parameters used for time delay estimation using the hybrid modeling can be potentially different for the cascaded 2-D PhC based ADF resonator, but for overall perspective of order of magnitudes, similar parameters are kept for all resonators. The estimated time delays of 25 ns, 76 ns, 102 ns and 153 ns for n=5, n=15, n=25, and n=30 cascaded 2-D PhC based ADF resonators respectively (cf. FIG. 14b). Unfortunately, the optical insertion loss associated with number of cascaded resonators may not be ignored in practice; hence with a practical optical insertion loss of 0.1 dB for each resonator, which is a reasonable estimation using larger dimension of 2-D PhC ADF, a 3-dB optical loss restricts the maximum order of n=30 for the cascaded ADF topology.

The next step of IOEC realization may be to add self-forced oscillation using the achievable optical delay in form of cascaded ADF that are implemented using 2-D PhC with defect and scattering rods. The two methods of optical SIL (SOIL) and electrical SIL (SEIL) are compared and the proposed SEIL is leading to a greater frequency stability. For example, with an equal injected power of delayed signal being lower by 20 dB compared to free-running MML case, then a 6 dB improvement in phase noise is experienced for SEIL. Therefore, an optical modulator based on phase modulation (i.e., PM) is selected to avoid any changes in the bias point of intensity modulators (i.e., IM using Mach-Zehnder modulators) that are sensitive to piezo- and pyro-electric of electro-optic material. Moreover, improved performance of this circuit is achieved by taking advantage of slow-light feature induced by placing a one-dimensional (1-D) photonic crystal (PhC) layer for tailoring optical group index of various optical waveguides to achieve a larger group index than light-cone characteristics. 1-D PhC layer with distinct geometry and materials indices of refraction to control nonlinear relationship of angular frequency, ⊡, and phase propagation constant, ⊡, of the guided light inside the optical waveguide. This reduced phase velocity causes a greater phase modulation sensitivity than homogenous optical waveguides.

As analytically calculated, a reduced optical link loss and noise figure impact far-away from carrier phase noise. While the reduced flicker corner frequency results in improved close-in to carrier phase noise. As depicted in FIG. 1, the Si-substrate may be used to develop not only low loss optical waveguides for passive components, such as optical delays, but SiGe HBT are advocated for reduced AM-PM noise in RF amplifiers (LNA and DA).

For better evaluation the performance degradation due to phase fluctuation, the timing jitter of the 125-mode SML Self-forced techniques could be used to restore any impact of the random phase error, as depicted in FIG. 15. With the same parameters introduced before for optical delay noise figure and longer optical delays of 1 μs and 5 μs, self-forced oscillation of MML that is SML, but suffers a small random phase error within variance of ±0.5°. Phase noise of −111 dBc/Hz and −108.6 dBc/Hz are calculated at 1 kHz for 125-mode-SML with ±0.5° random phase for each optical mode of 125-mode that suffers from a random phase. The predicted phase noise of SML with SEILDPLL of 1 μs and 5 μs is calculated to improve from −131.7 dBc/Hz to −140.2 dBc/Hz at 10 kHz offset of 10 GHz carrier signal.

This heterogeneous integration of InP components on Si-Photonic with SiGe HBT technologies realized a seamless integration between electronic and optical circuits.

A number of analytical foundations may help with design of the IOEC. Of particular note in design of the MML may be mode gap frequency that decides the RF output tunability range. Note the maximum RF tuning range is within $f_{gap}/2$. So, there may always be compromise between RF tunability range and maximum modes number:

$$f_{gap} = \frac{c}{2 * L * n_{eff}} \tag{1}$$

In addition, a larger layer numbers in a longer DBR length provides a higher reflection rate compared to a short DBR length according to equation 2; $n_0$ and $n_s$ are the indices of refraction of incident and substrate materials, while N is the total number of the layers:

$$R = \left[ \frac{n_0(n_H)^{2N} - n_s(n_L)^{2N}}{n_0(n_H)^{2N} + n_s(n_L)^{2N}} \right]^2 \tag{2}$$

The relative spectral width dependence on the DBR's high index over low index ratio is calculated using equation where with appropriate index ratio selection, DBR bandwidth may be adjusted according to the performance requirement:

$$\frac{\Delta f_0}{f_0} = \frac{4}{\pi} \arcsin\left( \frac{n_H - n_L}{n_H + n_L} \right) \tag{3}$$

These parameters may be appropriately designed to meet the required fractional bandwidth, number of sections N of DBR and related index difference, and the key parameter of frequency gap among multi-mode laser modes. These parameters may be relevant in terms of realization of broadband frequency synthesizers.

In cascaded optical delay elements using MRR based ADF, the estimated on-resonance transfer function is calculated from:

$$H_{drop} = \prod_{i-1}^{n} \frac{-\sqrt{(1-\gamma_1)\kappa_1(1-\gamma_2)\kappa_2}\,e^{-(\alpha L/4 + j\pi n_g L_i/\lambda)}}{1 - \sqrt{(1-\gamma_1)(1-\kappa_1)(1-\gamma_2)(1-\kappa_2)}\,e^{-(\alpha L/2 + j2\pi n_g L_i/\lambda)}} \quad (4)$$

where $y_{1\&2}$ are the coupling insertion loss in upper and lower coupling region, $K_{1\&2}$ are the coupling factors for each coupler, a denotes the optical waveguide loss in Np/m, $L_i$ is the circumference of each micro-disk resonator waveguide, and ng is the group refractive index.

All variables used in Equation (4) can be different for each ADF resonator. OptiFDTD mode-solver is employed to calculate the effective refractive index $n_{eff}$ of the ridge waveguide structure versus optical wavelength $\lambda$. Group index of ng represents the waveguide dispersion characteristics with respect to $\lambda$ and is defined as $n_{eff}-\lambda_0\cdot\partial n_{eff}/\partial_L$. In addition, Analytical solution known as 'Marcatili method' is employed to estimate the coupling coefficient between the bus waveguide and ring waveguide. The coupling coefficient along z-axis for TE-mode wave is expressed by $$\kappa = 1 - \left\{\cos\left[\int_{-L/2}^{L/2} 2\left(\frac{k_x A_3}{\pi}\right)^2 \frac{k_1\sqrt{1-(n_3/n_1)^2}}{k_z w}\sqrt{1-\left(\frac{k_x A_3}{\pi}\right)^2} \times \ldots\right.\right.$$
$$\left.\left. \exp\left\{-\pi\frac{g_{min}+R(1-\sin\{\cos^{-1}[s(z)/R]\})}{A_3}\ldots\times\sqrt{1-\left(\frac{k_x A_3}{\pi}\right)^2}\right\}ds\right]\right\}^2 \quad (5)$$

where $k_x=\pi/(w+2n_3{}^2A_3/\pi n_1{}^2)$ and $k_y=\pi/\{h+(A_2+A_3)/\pi)\}$ are the tranverse propagation constant along x-axis and y-axis, respectively, with the amplitude coefficient $Av=\pi/(k_1{}^2-k_y{}^2)^{1/2}$. Note, the propagation constant of a plane wave in a midum of refractive index n, and wavelength $\lambda$ is defined by $k_v=2\pi n_v/\lambda$, where v=1, 2, 3 in free-space. Finally, $k_z=(k_1{}^2-k_x{}^2-k_y{}^2)^{1/2}$ is the axial propgation constant.

EMBODIMENTS

Embodiment 1

An opto-electronic oscillator (OEO) that uses self-forced oscillation techniques that control optical delays to achieve frequency stability, comprising an opto-electronic oscillator chip (IOEC) that includes an RF frequency synthesizer.

Embodiment 1

The OEO of embodiment 1, further comprising electro-optic (E-O) modulators with 1-D photonic crystal (PhC) based slow-light structures that improve phase modulation capability.

Embodiment 1

The OEO of embodiment 2, further comprising cascaded add-drop filter (ADF) resonators for high-Q filtering delay elements.

Embodiment 1

The OEO of embodiment 3, further comprising a InGaAsP/InP MML chip that functions as a phase to intensity convertor (PM-IM).

Embodiment 1

The OEO of embodiment 4, wherein a self-electrical injection locked (SEIL) and dual self-phase-locked (DSPLL) loops provide for increased frequency stability.

Embodiment 1

The OEO of embodiment 1, wherein an OEO operating frequency is between microwave and millimeter wave.

Embodiment 1

The OEO of embodiment 1 wherein the OEO size is less than 10 cm3.

Embodiment 1

The OWO of embodiment 1, wherein performance is relatively unaffected between −40 C to 80 C.

Embodiment 1

The OEO of embodiment 1, wherein performance is relatively unaffected up to vibrations of 40 g.

Embodiment 1

The OEO of embodiment 1, wherein performance is relatively unaffected at low timing jitter less than 5 fs for 40 GHz carrier.

Embodiment 1

The OEO of embodiment 1, wherein performance is relatively unaffected using wall-plug efficiency output power greater than 10 dBm and below 1 W.

Embodiment 1

The OEO of embodiment 1, further comprising free-running III-V based multi-mode laser (MML) diodes with over 60 modes and intermodal oscillation frequency compatible with desired RF carrier signal.

Embodiment 1

The OEO of embodiment 12, wherein frequency tuning is achieved by optical p-i-n phase modulator integrated within a distributed Bragg reflector (DBR) optical cavity.

Embodiment 1

The OEO of embodiment 13, wherein an external electro-absorption modulator (EAM) controls the number of modes.

Embodiment 1

The OEO of embodiment 14, wherein the frequency gap is controlled by selecting a length of optical cavity realized using Bragg reflectors and is twice of the maximum frequency tuning used for frequency synthesis.

Embodiment 1

The OEO of embodiment 1, wherein the stabilized RF signal is achieved using self-mode locking (SML) combined with self-electrical injection-locked and dual self-phase-locked loop (SEILDPLL).

Embodiment 1

The OEO of embodiment 16, wherein the self-forced oscillation of SEILDPLL relies on slow-light feature of a 1D-PhC phase modulator and a 2-D PhC optical delay using cascaded add-drop filter (ADF) that are realized using Si-Photonics.

Embodiment 1

The OEO of embodiment 17, further comprising a low phase noise RF amplifier and phase detectors implemented using SiGe HBT technology.

Embodiment 1

The OEO of embodiment 18, further comprising heterogeneous integration of InP based MML and matching optical photodetectors made on a 36 cm2 SiP chip.

While the invention has been described in the attached paper and figures with reference to the embodiments described herein, a person of ordinary skill in the art would understand that various changes or modifications may be made thereto without departing from the scope of the claims.

We claim:

1. An opto-electronic oscillator (OEO) that uses self-forced oscillation techniques that control optical delays to achieve frequency stability, comprising an opto-electronic oscillator chip (IOEC) that includes an RF frequency synthesizer, wherein the self-forced oscillation is implemented using a 1-D photonic crystal (PhC) slow-light phase modulator integrated with Si-photonics.

2. The OEO of claim 1, further comprising electro-optic (E-O) modulators with 1-D photonic crystal (PhC) based slow-light structures that improve phase modulation capability.

3. The OEO of claim 2, further comprising cascaded add-drop filter (ADF) resonators for high-Q filtering delay elements.

4. The OEO of claim 3, further comprising a InGaAsP/InP MML chip that functions as a phase to intensity convertor (PM-IM).

5. The OEO of claim 4, wherein a self-electrical injection locked (SEIL) and dual self-phase-locked (DSPLL) loops provide for increased frequency stability.

6. The OEO of claim 1, wherein an OEO operating frequency is between microwave and millimeter wave.

7. The OEO of claim 1 wherein the OEO size is less than 10 cm3.

8. The OEQ of claim 1, wherein performance is relatively unaffected between −40 C to 80 C.

9. The OEO of claim 1, wherein performance is relatively unaffected up to vibrations of 40 g.

10. The OEO of claim 1, wherein performance is relatively unaffected at low timing jitter less than 5 fs for 40 GHz carrier.

11. The OEO of claim 1, wherein performance is relatively unaffected using wall-plug efficiency output power greater than 10 dBm and below 1 W.

12. The OEO of claim 1, further comprising free-running III-V based multi-mode laser (MML) diodes with over 60 modes and intermodal oscillation frequency compatible with desired RF carrier signal.

13. The OEO of claim 12, wherein frequency tuning is achieved by optical p-i-n phase modulator integrated within a distributed Bragg reflector (DBR) optical cavity.

14. The OEO of claim 13, wherein an external electro-absorption modulator (EAM) controls the number of modes.

15. The OEO of claim 14, wherein the frequency gap is controlled by selecting a length of optical cavity realized using Bragg reflectors and is twice of the maximum frequency tuning used for frequency synthesis.

16. The OEO of claim 1, wherein the stabilized RF signal is achieved using self-mode locking (SML) combined with self-electrical injection-locked and dual self-phase-locked loop (SEILDPLL), wherein the SEIL DSPLL relies on slow-light features of a 1-D PhC and a 2-D PhC cascaded add-drop filter (ADF) in Si-photonics.

17. The OEO of claim 16, wherein the self-forced oscillation of SEILDPLL relies on slow-light feature of a 1D-PhC phase modulator and a 2-D PhC optical delay using cascaded add-drop filter (ADF) that are realized using Si-Photonics.

18. The OEO of claim 17, further comprising a low phase noise RF amplifier and phase detectors implemented using SiGe HBT technology.

19. The OEO of claim 18, further comprising heterogeneous integration of InP based MML and matching optical photodetectors made on a 36 cm2 SiP chip.

* * * * *